(12) United States Patent
Nam et al.

(10) Patent No.: US 10,162,259 B2
(45) Date of Patent: *Dec. 25, 2018

(54) PHOTORESIST COMPOSITION AND COLOR FILTER USING THE SAME

(71) Applicant: SAMSUNG DISPLAY CO., LTD., Yongin-si, Gyeonggi-do (KR)

(72) Inventors: Minki Nam, Yongin-si (KR); Kyoungwon Park, Yongin-si (KR); Baekhee Lee, Yongin-si (KR); Youngmin Kim, Yongin-si (KR); Haeil Park, Yongin-si (KR)

(73) Assignee: SAMSUNG DISPLAY CO., LTD., Yongin-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/697,992

(22) Filed: Sep. 7, 2017

(65) Prior Publication Data

US 2018/0074401 A1 Mar. 15, 2018

(30) Foreign Application Priority Data

Sep. 13, 2016 (KR) ........................ 10-2016-0118217

(51) Int. Cl.
*G03F 7/031* (2006.01)
*G02B 5/20* (2006.01)
(Continued)

(52) U.S. Cl.
CPC ........... *G03F 7/0007* (2013.01); *G02B 5/201* (2013.01); *G02F 1/133377* (2013.01); *G03F 7/0047* (2013.01); *G03F 7/031* (2013.01)

(58) Field of Classification Search
CPC ....... G03F 7/0007; G03F 7/031; G02B 5/201; G02B 5/206
(Continued)

(56) References Cited

U.S. PATENT DOCUMENTS 6,322,901 B1 11/2001 Bawendi et al.
7,649,594 B2 1/2010 Kim et al.
(Continued)

FOREIGN PATENT DOCUMENTS

KR 10-2010-0053409 5/2010
KR 10-2014-0006310 1/2014
(Continued)

OTHER PUBLICATIONS

Hak-Sung Jung, Functionalized Silica Nanoparticles and Their Applications, Feb. 2014.
(Continued)

*Primary Examiner* — John A McPherson
(74) *Attorney, Agent, or Firm* — Lee & Morse, P.C.

(57) ABSTRACT

A photoresist composition including a photoresist composition includes a photo-luminescence nanocomposite, a photopolymerizable monomer, a first photopolymerization initiator, a second photopolymerization initiator, a binder resin, and a solvent. The photo-luminescence nanocomposite includes a first quantum dot nanocomposite, a second quantum dot nanocomposite, or a combination thereof. The first quantum dot nanocomposite includes a first quantum dot nanoparticle and a first coating layer surrounding the first quantum dot nanoparticle, the first coating layer including a first inorganic material. The second quantum dot nanocomposite includes a second quantum dot nanoparticle and a second coating layer surrounding the second quantum dot nanoparticle, the second coating layer including a second inorganic material. The first photopolymerization initiator includes an oxime-based compound, and the second photopolymerization initiator includes an acetophenone-based compound, a thioxanthone-based compound, a benzophenone-based compound, or a combination thereof.

20 Claims, 6 Drawing Sheets

(51) Int. Cl.
*G03F 7/00* (2006.01)
*G02F 1/1333* (2006.01)
*G03F 7/004* (2006.01)

(58) Field of Classification Search
USPC .................................................. 430/7, 281.1
See application file for complete search history.

(56) References Cited

U.S. PATENT DOCUMENTS

| | | | |
|---|---|---|---|
| 8,471,969 | B2 | 6/2013 | Banin et al. |
| 9,885,954 | B2* | 2/2018 | Lee ........................ G03F 7/0007 |
| 2015/0184066 | A1 | 7/2015 | Kwon et al. |
| 2016/0011506 | A1* | 1/2016 | Gu .......................... G03F 7/027 430/288.1 |
| 2016/0068749 | A1 | 3/2016 | Kwon et al. |
| 2016/0322541 | A1* | 11/2016 | Liu ........................ H01L 33/508 |
| 2016/0362602 | A1* | 12/2016 | Xin ........................ C09K 11/02 |
| 2017/0075215 | A1 | 3/2017 | Lee et al. |
| 2017/0176811 | A1* | 6/2017 | Gu .................... G02F 1/133514 |
| 2017/0194530 | A1* | 7/2017 | Zhou ........................ G03F 1/00 |

FOREIGN PATENT DOCUMENTS

| | | |
|---|---|---|
| KR | 10-1396871 | 5/2014 |
| KR | 10/-2017-0031820 | 3/2017 |
| WO | WO 2010/095140 A2 | 8/2010 |

OTHER PUBLICATIONS

A.P. Alivisatos, Semiconductor Clusters, Nanocrystals, and Quantum Dots, Science, New Series, vol. 271, No. 5251, Feb. 16, 2006, 993-937.

Youlin Zhang, Photoluminescence Quenching of CdSe Core/Shell Quantum Dots by Hole Transporting Materials, J. Phys. Chem. 2009, 113, 1886-1890.

Chittreeya Tansakul, Distance-Dependent Fluorescence Quenching and Binding of CdSe Quantum Dots by Functionalized Nitroxide Radicals, J. Phys. Chem. C 2010, 114, 7793-7805.

* cited by examiner

PHOTORESIST COMPOSITION AND COLOR FILTER USING THE SAME

CROSS-REFERENCE TO RELATED APPLICATION

Korean Patent Application No. 10-2016-0118217, filed on Sep. 13, 2016, in the Korean Intellectual Property Office, and entitled: "Photoresist Composition and Color Filter Using the Same," is incorporated by reference herein in its entirety.

BACKGROUND

1. Field

Embodiments relate to a photoresist composition and a color filter using the same.

2. Description of the Related Art

Liquid crystal display (LCD) apparatuses are flat-panel display apparatuses currently used in a wide range of applications. An LCD includes a pair of display plates on which a pixel electrode and a common electrode are arranged, with a liquid crystal layer interposed therebetween. An LCD displays an image by creating an electric field in a liquid crystal layer via application of electric field-creating electrodes, aligning an orientation of liquid crystal molecules of the liquid crystal layer thereby, and controlling polarization of incident light.

SUMMARY

Embodiments are directed to a photoresist composition including a photo-luminescence nanocomposite, a photopolymerizable monomer, a first photopolymerization initiator, a second photopolymerization initiator, a binder resin, and a solvent. The photo-luminescence nanocomposite includes a first quantum dot nanocomposite, a second quantum dot nanocomposite, or a combination thereof. The first quantum dot nanocomposite includes a first quantum dot nanoparticle and a first coating layer surrounding the first quantum dot nanoparticle, the first coating layer including a first inorganic material. The second quantum dot nanocomposite includes a second quantum dot nanoparticle and a second coating layer surrounding the second quantum dot nanoparticle, the second coating layer including a second inorganic material. The first photopolymerization initiator includes an oxime-based compound, and the second photopolymerization initiator includes an acetophenone-based compound, a thioxanthone-based compound, a benzophenone-based compound, or a combination thereof.

The first quantum dot nanoparticle may have a core-shell-shell structure including a core including a first semiconductor nanocrystal, a first shell surrounding the core and including a second semiconductor nanocrystal, and a second shell including a third semiconductor nanocrystal.

The first semiconductor nanocrystal, the second semiconductor nanocrystal, and the third semiconductor nanocrystal may each independently include CdS, CdSe, CdTe, ZnS, ZnSe, ZnTe, InP, InN, InAs, GaN, GaP, GaAs, ZnCdS, ZnSeS, ZnCdSeS, CdZnSe, InZnP, InGaP, GaPZnS, GaPZnSe, GaPZnSeS, or a combination thereof.

The second quantum dot nanoparticle may have a core-shell structure including a core having a fourth semiconductor nanocrystal and a shell surrounding the core, the shell including a fifth semiconductor nanocrystal.

The fourth semiconductor nanocrystal and the fifth semiconductor nanocrystal may each independently include CdS, CdSe, CdTe, ZnS, ZnSe, ZnTe, InP, InN, InAs, GaN, GaP, GaAs, ZnCdS, ZnSeS, ZnCdSeS, CdZnSe, InZnP, InGaP, GaPZnS, GaPZnSe, GaPZnSeS, or a combination thereof.

The first inorganic material and the second inorganic material may each independently include $SiO_2$, $TiO_2$, $ZnO_2$, $Al_2O_3$, alumina, or a combination thereof.

The first quantum dot nanocomposite may include a first auxiliary layer between the first quantum dot nanoparticle and the first coating layer. The second quantum dot nanocomposite may further include a second auxiliary layer between the second quantum dot nanoparticle and the second coating layer.

The first auxiliary layer and the second auxiliary layer may each independently include polyvinylpyrrolidone, polystyrene, polymethylmethacrylate, or a combination thereof.

The photopolymerizable monomer may include ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, dipentaerythritol penta(meth)acrylate-succinic acid ester, or a combination thereof.

The oxime-based compound includes 1,2-octanedione, 2-dimethylamino-2-(4-methylbenzyl)-1-(4-morpholine-4-yl-phenyl)-butane-1-one, 1-(4-phenylsulfanylphenyl)-butane-1,2-dione-2-oxime-O-benzoate, 1-(4-phenylsulfanylphenyl)-octane-1,2-dione-2-oxime-O-benzoate, 1-(4-phenylsulfanylphenyl)-octane-1-one oxime-O-acetate, 1-(4-phenylsulfanylphenyl)-butane-1-one-2-oxime-O-acetate, 2-(O-benzoyloxime)-1-[4-(phenylthio)phenyl]-1,2-octanedione, 1-(O-acetyloxime)-1-[9-ethyl-6-(2-methylbenzoyl)-9H-carbazole-3-yl]ethanone, O-ethoxycarbonyl-α-oxyamino-1-phenylpropane-1-one, or a combination thereof.

The second photopolymerization initiator may include the acetophenone-based compound. The acetophenone-based compound may include 4-phenoxy dichloroacetophenone, 4-t-butyl dichloroacetophenone, 4-t-butyl trichloroacetophenone, 2,2-diethoxyacetophenone, 2-hydroxy-2-methyl-1-phenyl-propane-1-one, 1-(4-isopropylphenyl)-2-hydroxy-2-methyl-propane-1-one, 1-(4-dodecylphenyl)-2-hydroxy-2-methylpropane-1-one, 4-(2-hydroxyethoxy)-phenyl-(2-hydroxy-2-propyl)ketone, 1-hydroxy cyclohexyl phenyl ketone, 2-methyl-1-[4-(methylthio)phenyl]-2-morpholinopropane-1-one, or a combination thereof.

The second photopolymerization initiator may include the thioxanthone-based compound. The thioxanthone-based compound may include thioxanthone, 2-chloro thioxanthone, 2-methyl thioxanthone, isopropyl thioxanthone, 2,4-diethyl thioxanthone, 2,4-diisopropyl thioxanthone, or a combination thereof.

The second photopolymerization initiator may include the benzophenone-based compound. The benzophenone-based compound may include benzophenone, benzoyl benzoic acid, benzoyl benzoic acid methyl ester, 4-phenyl benzophenone, hydroxy benzophenone, 4-benzoyl-4'-methyl diphenyl sulfide, 3,3'-dimethyl-4-methoxy benzophenone, or a combination thereof.

The binder resin includes an epoxy resin, an acrylic resin, or a combination thereof.

The solvent may include ethylene glycol monoethyl ether, ethyl cellosolve acetate, 2-hydroxyethyl propionate, diethylene glycol monomethyl, propylene glycol monomethyl ether acetate, propylene glycol propyl ether acetate, or a combination thereof.

Embodiments are also directed to a color filter including a first pixel region, a second pixel region, and a third pixel region. The first pixel region includes a first color conversion layer to convert incident light into light having a first color. The second pixel region includes a second conversion layer to convert incident light into light having a second color. The third pixel region includes a light scattering material layer. The first color conversion layer includes a photocured product of a first photoresist composition, and the second color conversion layer includes a photocured product of a second photoresist composition. The first photoresist composition and the second photoresist composition are different from each other and are each independently selected from a photoresist composition according to claim 1.

The photo-luminescence nanocomposite included in the first photoresist composition may include a first quantum dot nanocomposite. The photo-luminescence nanocomposite included in the second photoresist composition may include a second quantum dot nanocomposite.

The light scattering material layer may include $TiO_2$.

The incident light may be blue light.

The first color may be red and the second color may be green.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings: however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Photoresist Composition

Hereinafter, a photoresist composition according to an embodiment will be described.

The photoresist composition includes a photo-luminescence nanocomposite, a photopolymerizable monomer, a first photopolymerization initiator, a second photopolymerization initiator, a binder resin, and a solvent.

Photo-Luminescence Nanocomposite

The photo-luminescence nanocomposite, used as a base of the photoresist composition, emits light upon receiving external light. In this case, wavelengths of the external light and light emitted from the photo-luminescence nanocomposite may be the same or different.

The photo-luminescence nanocomposite may include a first quantum dot nanocomposite, a second quantum dot nanocomposite, or any combination thereof. According to an embodiment, the photo-luminescence nanocomposite may include the first quantum dot nanocomposite or a second quantum dot nanocomposite.

An amount of the photo-luminescence nanocomposite may be from about 1 part by weight to about 50 parts by weight based on 100 parts by weight of a total amount of the photoresist composition. If the amount of the photo-luminescence nanocomposite is less than 1 part by weight, luminescent efficiency may not be sufficient. On the other hand, if the amount of the photo-luminescence nanocomposite is greater than 50 parts by weight, a pixel pattern may not be appropriately formed due to relatively lower amounts of the other components.

The first quantum dot nanocomposite may include a first quantum dot nanoparticle, including, for example, polysilsesquioxane, and a first coating layer surrounding the first quantum dot nanoparticle and including a first inorganic material. The second quantum dot nanocomposite may include a second quantum dot nanoparticle and a second coating layer surrounding the second quantum dot nanoparticle and including a second inorganic material. For example, the first quantum dot nanocomposite may have a structure in which the surface of the first quantum dot nanoparticle is surrounded by the first coating layer such that the first quantum dot nanoparticle is enclosed in the first coating layer. The second quantum dot nanocomposite may have a structure in which the surface of the second quantum dot nanoparticle is surrounded by the second coating layer such that the second quantum dot nanoparticle is enclosed in the second coating layer. The first quantum dot nanoparticle and the first coating layer and the second quantum dot nanoparticle and the second coating layer may be bonded by attractive force, e.g., Van der Waals' interaction, respectively.

The first quantum dot nanoparticle and the second quantum dot nanoparticle may be particles having crystal structures with several to several ten-nanometer sizes and formed of several hundreds to several thousands of atoms. Due to very small particle sizes, quantum confinement effect may be observed in the first quantum dot nanoparticle and the second quantum dot nanoparticle. The term "quantum confinement effect" refers to a phenomenon in which a band gap of an object increases as a size of the object decreases to a nanometer or less. Thus, when light having a wavelength with an energy greater than band gaps of the first quantum dot nanoparticle and the second quantum dot nanoparticle is applied to the first quantum dot nanoparticle and the second quantum dot nanoparticle, the first quantum dot nanoparticle and the second quantum dot nanoparticle absorb the light undergoing transitions into excited states. The first quantum dot nanoparticle and the second quantum dot nanoparticle then fall to ground states while emitting light having predetermined wavelengths. The wavelengths of the emitted light therefrom correspond to the band gaps.

According to an embodiment, the first quantum dot nanoparticle may include a first semiconductor nanocrystal. The first semiconductor nanocrystal may include CdS, CdSe, CdTe, ZnS, ZnSe, ZnTe, InP, InN, InAs, GaN, GaP, GaAs, ZnCdS, ZnSeS, ZnCdSeS, CdZnSe, CdZnS, InZnP, InGaP, GaPZnS, GaZnSeS, or any combination thereof.

According to an embodiment, the first quantum dot nanoparticle may have a core-shell structure including a core having the first semiconductor nanocrystal and a shell surrounding the core and having a second semiconductor nanocrystal.

According to an embodiment, the first semiconductor nanocrystal and the second semiconductor nanocrystal may each independently include CdS, CdSe, CdTe, ZnS, ZnSe, ZnTe, InP, InN, InAs, GaN, GaP, GaAs, ZnCdS, ZnSeS, ZnCdSeS, CdZnSe, CdZnS, InZnP, InGaP, GaPZnS, GaZnSeS, or any combination thereof.

For example, the first quantum dot nanoparticle having a core-shell structure may be a cadmium-free (Cd-free) quantum dot having a core-shell structure or a cadmium-based (Cd-based) quantum dot having a core-shell structure. According to an embodiment, the Cd-free quantum dot (Cd-free QD) having a core-shell structure may be InP/ZnS, InZnP/ZnSeS, InGaP/GaPZnS, or InGaP/GaZnSeS. The Cd-free quantum dot having a core-shell structure may have a core diameter of about 1.3 nm to about 2.0 nm and a shell thickness of about 0.15 nm to about 5.0 nm. According to an embodiment, the Cd-based quantum dot (Cd-based QD) having a core-shell structure may be CdSe/ZnSeS, CdZnS/ZnCdSeS, or CdZnSe/ZnCdS. The Cd-based quantum dot having a core-shell structure may have a core diameter of about 1.8 nm to about 3.0 nm and a shell thickness of about 1.0 nm to about 10.0 nm.

According to an embodiment, the first quantum dot nanoparticle may have a core-shell-shell structure including core having the first semiconductor nanocrystal, a first shell surrounding the core and having the second semiconductor nanocrystal, and a second shell having a third semiconductor nanocrystal.

According to an embodiment, the first semiconductor nanocrystal, the second semiconductor nanocrystal, and the third semiconductor nanocrystal may each independently include CdS, CdSe, CdTe, ZnS, ZnSe, ZnTe, InP, InN, InAs, GaN GaP, GaAs, ZnCdS, ZnSeS, ZnCdSeS, CdZnSe, InZnP, InGaP, GaPZnS, GaPZnSe, GaPZnSeS, or any combination thereof.

For example, the first quantum dot nanoparticle having a core-shell-shell structure may be a Cd-free quantum dot having a core-shell-shell structure or a Cd-based quantum dot having a core-shell-shell structure. According to an embodiment, the Cd-free quantum dot having a core-shell-shell structure may be ZnSe/InP/ZnSe, GaP/InGaP/GaP, ZnSeS/InZnP/ZnSeS, GaPZnS/InP/GaPZnS, GaPZnSe/InGaP/GaPZnSe, or GaPZnSeS/InZnP/GaPZnSeS. The Cd-free quantum dot having a core-shell-shell structure may have a core diameter of about 1.0 nm to about 4.0 nm, a first shell thickness of about 1.3 nm to about 2.0 nm, and a second shell thickness of about 1.0 nm to about 4.0 nm. According to another embodiment, the Cd-based quantum dot having a core-shell-shell structure may be CdS/CdSe/ZnCdS, CdS/CdSe/CdS, ZnCdS/CdZnSe/ZnCdS, ZnSe/CdSe/ZnSe, ZnSeS/CdSe/ZnSe, or ZnCdSeS/CdZnSe/ZnCdSe. The Cd-based quantum dot having a core-shell-shell structure may have a core diameter of about 1.0 nm to about 4.0 nm, a first shell thickness of about 1.4 nm to about 2.0 nm and a second shell thickness of about 1.0 nm to about 4.0 nm.

According to an embodiment, the second quantum dot nanoparticle may include a fourth semiconductor nanocrystal. The fourth semiconductor nanocrystal may include CdS, CdSe, CdTe, ZnS, ZnSe, ZnTe, InP, InN, InAs, GaN, GaP, GaAs, ZnCdS, ZnSeS, ZnCdSeS, CdZnSe, CdZnS, InZnP, InGaP, GaPZnS, GaZnSeS, or any combination thereof.

According to another embodiment, the second quantum dot nanoparticle may have a core-shell structure including a core having the fourth semiconductor nanocrystal and a shell surrounding the core and having a fifth semiconductor nanocrystal.

According to another embodiment, the fourth semiconductor nanocrystal and the fifth semiconductor nanocrystal may each independently include CdS, CdSe, CdTe, ZnS, ZnSe, ZnTe, InP, InN, InAs, GaN, GaP, GaAs, ZnCdS, ZnSeS, ZnCdSeS, CdZnSe, CdZnS, InZnP, InGaP, GaPZnS, GaZnSeS, or any combination thereof.

For example, the second quantum dot nanoparticle having a core-shell structure may be a Cd-free quantum dot having a core-shell structure or a Cd-based quantum dot having a core-shell structure. According to an embodiment, the Cd-free quantum dot (Cd-free QD) having a core-shell structure may be InP/ZnS, InZnP/ZnSeS, InGaP/GaPZnS, or InGaP/GaZnSeS. The Cd-free quantum dot having a core-shell structure may have a core diameter of about 1.0 nm to about 1.3 nm and a shell thickness of about 0.15 nm to about 5.0 nm. According to an embodiment, the Cd-based quantum dot (Cd-based QD) having a core-shell structure may be CdZnSe/ZnS, CdSe/ZnSeS, CdZnS/ZnCdSeS, or CdZnSe/ZnCdS. The Cd-based quantum dot having a core-shell structure may have a core diameter of about 1.0 nm to about 1.7 nm and a shell thickness of about 1.0 nm to about 10.0 nm.

According to an embodiment, the second quantum dot nanoparticle may have a core-shell-shell structure including a core having the fourth semiconductor nanocrystal, a first shell surrounding the core and having the fifth semiconductor nanocrystal, and a second shell having a sixth semiconductor nanocrystal.

According to an embodiment, the fourth semiconductor nanocrystal, the fifth semiconductor nanocrystal, and the sixth semiconductor nanocrystal may each independently include CdS, CdSe, CdTe, ZnS, ZnSe, ZnTe, InP, InN, InAs, GaN, GaP, GaAs, ZnCdS, ZnSeS, ZnCdSeS, CdZnSe, InZnP, InGaP, GaPZnS, GaPZnSe, GaPZnSeS, or any combination thereof.

For example, the second quantum dot nanoparticle having a core-shell-shell structure may be a Cd-free quantum dot having a core-shell-shell structure or a Cd-based quantum dot having a core-shell-shell structure. According to an embodiment, the Cd-free quantum dot having a core-shell-shell structure may be ZnSe/InP/ZnSe, GaP/InGaP/GaP, ZnSeS/InZnP/ZnSeS, GaPZnS/InP/GaPZnS, GaPZnSe/InGaP/GaPZnSe, or GaPZnSeS/InZnP/GaPZnSeS. The Cd-free quantum dot having a core-shell-shell structure may have a core diameter of about 1.0 nm to about 4.0 nm, a first shell thickness of about 0.15 nm to about 1.2 nm, and a second shell thickness of about 1.0 nm to about 4.0 nm. According to an embodiment, the Cd-based quantum dot having a core-shell-shell structure may be CdS/CdSe/CdS, ZnCdS/CdZnSe/ZnCdS, ZnSe/CdSe/ZnSe, ZnSeS/CdSe/ZnSe, or ZnCdSeS/CdZnSe/ZnCdSe. The Cd-based quantum dot having a core-shell-shell structure may have a core diameter of about 1.0 nm to about 4.0 nm, a first shell thickness of about 0.15 nm to about 1.3 nm, and a second shell thickness of about 1.0 nm to about 4.0 nm.

The first quantum dot nanoparticle and the second quantum dot nanoparticle may be synthesized by known synthesis methods, such as a wet chemical process, metal organic chemical vapor deposition (MOCVD), or a molecular beam epitaxy process (MBE). The wet chemical process is a process of growing particles by adding a precursor material to an organic solvent. In this process, the organic solvent coordinates with the surfaces of the quantum dot crystals, functioning as a dispersant during the growth of the particles, thereby controlling the growth of the crystals. Thus, the wet chemical process may control the growth of nanoparticles more easily with lower manufacturing costs than the MOCVD and MBE.

The first coating layer and the second coating layer may include non-conductive materials of the first inorganic material and the second inorganic material, respectively. Accordingly, the first quantum dot nanoparticle surrounded by the first coating layer and the second quantum dot nanoparticle surrounded by the second coating layer may be spatially and electrically separated from the first photopolymerization initiator and the second photopolymerization initiator included in the photoresist composition. Thus, radiative recombination of the first quantum dot nanoparticle or the second quantum dot nanoparticle, which could be caused when the first photopolymerization initiator or the second photopolymerization initiator binds to the surface of the first quantum dot nanoparticle or the second quantum dot nanoparticle, may be prevented. Accordingly, extinction of light may be prevented in the first quantum dot nanoparticle or second quantum dot nanoparticle, and thus luminescent efficiency may increase.

According to an embodiment, the first inorganic material and the second inorganic material may each independently include $SiO_2$, $TiO_2$, $ZnO_2$, $Al_2O_3$, alumina, or any combination thereof. According to another embodiment, the first inorganic material and the second inorganic material may each independently be $SiO_2$ or $TiO_2$. According to another embodiment, the first inorganic material and the second inorganic material may be $SiO_2$.

When external light (e.g., blue light) is applied to the first quantum dot nanocomposite and the second quantum dot nanocomposite, the first quantum dot nanocomposite and the second quantum dot nanocomposite may emit light having a wavelength of about 300 nm to about 800 nm, respectively. According to an embodiment, when external light (e.g., blue light) is applied to the first quantum dot nanocomposite and the second quantum dot nanocomposite, the first quantum dot nanocomposite and the second quantum dot nanocomposite emit light having a wavelength of about 440 nm to about 680 nm, respectively.

According to an embodiment, when external light (e.g., blue light) is applied to the first quantum dot nanocomposite, the first quantum dot nanocomposite may emit light having a wavelength of about 610 nm to about 670 nm (i.e., red light). When external light (e.g., blue light) is applied to the second quantum dot nanocomposite, the second quantum dot nanocomposite may emit light having a wavelength of about 510 nm to about 570 nm (i.e., green light).

According to an embodiment, the first quantum dot nanocomposite may have a diameter of about 20 nm to about 50 nm, and the second quantum dot nanocomposite may have a diameter of about 15 nm to about 30 nm. According to an embodiment, the first quantum dot nanocomposite may have a diameter of about 25 nm to about 43 nm, and the second quantum dot nanocomposite may have a diameter of about 20 nm to about 32 nm.

According to an embodiment, the first quantum dot nanocomposite may further include a first auxiliary layer interposed between the first quantum dot nanoparticle and the first coating layer, and the second quantum dot nanocomposite may further include a second auxiliary layer interposed between the second quantum dot nanoparticle and the second coating layer.

The first auxiliary layer and the second auxiliary layer may reform hydrophobic surfaces of the first quantum dot nanocomposite and the second quantum dot nanocomposite into hydrophilic surfaces to improve a binding force between the first quantum dot nanocomposite and the first coating layer and between the second quantum dot nanocomposite and the second coating layer and to prevent a decrease in luminescent efficiency by inhibiting agglomeration of the quantum dot nanocomposite and preventing sol-gel reactions on the surfaces of the quantum dot nanocomposite.

According to an embodiment, the first auxiliary layer and the second auxiliary layer may each independently include polyvinylpyrrolidone, polystyrene, polymethylmethacrylate, or any combination thereof. According to an embodiment, the first auxiliary layer and the second auxiliary layer may include polyvinylpyrrolidone.

The amount of the photo-luminescence nanocomposite may be from about 15 to about 50 parts by weight based on 100 parts by weight of the total amount of the photoresist composition. If the amount of the photo-luminescence nanocomposite is within this range, a pattern may be easily formed.

A method of preparing the first quantum dot nanocomposite may include preparing a first quantum dot nanoparticle-containing dispersion by dispersing the first quantum dot nanoparticle in a solvent, adding a first inorganic material precursor to the dispersion, and isolating the first quantum dot nanocomposite. In this regard, the first quantum dot nanoparticle is as described above.

According to an embodiment, preparing the first quantum dot nanoparticle-containing dispersion may be performed by adding the first quantum dot nanoparticle and a solvent (e.g., ethanol) to an agitator at room temperature.

According to an embodiment, adding the first inorganic material precursor to the dispersion may be performed by adding the first inorganic material precursor to the first quantum dot nanoparticle-containing dispersion in the agitator and stirring the mixture at room temperature for about 10 minutes.

According to an embodiment, the first inorganic material precursor may include tetraethyl orthosilicate (TEOS), as an example.

According to an embodiment, an amount of the first inorganic material precursor may be from about 10 to about 1,000 parts by weight based on 100 parts by weight of the first quantum dot nanoparticle.

According to an embodiment, isolating the first quantum dot nanocomposite may be performed by isolating the first quantum dot nanocomposite via centrifugation of the dispersion at 20,000 rpm for 20 minutes, preparing a first quantum dot nanocomposite-containing dispersion by re-dispersing the first quantum dot nanocomposite in the solvent (e.g., ethanol), and isolating the first quantum dot nanocomposite via centrifugation of the first quantum dot nanocomposite-containing dispersion at 4,000 rpm.

Photopolymerizable Monomer

The photopolymerizable monomer may be polymerized when exposed to light to form a pattern during a pattern formation process.

For example, the photopolymerizable monomer may include a monofunctional ester of a (meth)acrylic acid having at least one ethylenically unsaturated double bond, a multifunctional ester of (meth)acrylic acid having at least one ethylenically unsaturated double bond, or any combination thereof. If a photopolymerizable compound has the ethylenically unsaturated double bond, polymerization thereof may be sufficiently performed when exposed to light during the pattern formation process. A pattern having excellent heat resistance, light resistance, and chemical resistance may be formed.

According to an embodiment, the photopolymerizable monomer may include ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, dipentaerythritolpenta(meth)acrylate-succinic acid ester, or any combination thereof.

An amount of the photopolymerizable monomer may be from about 1 to about 30 parts by weight based on 100 parts by weight of the total amount of the photoresist composition. According to an embodiment, the amount of the photopolymerizable monomer may be from about 5 to about 20 parts by weight based on 100 parts by weight of the total amount of the photoresist composition. If the amount of the photopolymerizable monomer is within this range, a color filter prepared using the photoresist composition may have excellent pattern characteristics and developing properties.

First Photopolymerization Initiator and Second Photopolymerization Initiator

The first photopolymerization initiator and the second photopolymerization initiator may initiate polymerization of the photopolymerizable monomer depending on wavelengths of light such as visible light, ultraviolet light, and far-ultraviolet light.

The photoresist composition may include the first photopolymerization initiator and the second photopolymerization initiator. Accordingly, high degrees of photocuring thereof may prevent undercut formation in a pattern formed using the photoresist composition. Thus, a color filter formed using the photoresist composition may have excellent pattern characteristics.

The first photopolymerization initiator may include an oxime-based compound, and the second photopolymerization initiator may include an acetophenone-based compound, a thioxanthone-based compound, a benzophenone-based compound, or any combination thereof.

According to an embodiment, the oxime-based compound may include 1,2-octanedione, 2-dimethylamino-2-(4-methylbenzyl)-1-(4-morpholine-4-yl-phenyl)-butane-1-one, 1-(4-phenylsulfanylphenyl)-butane-1,2-dione-2-oxime-O-benzoate, 1-(4-phenylsulfanylphenyl)-octane-1,2-dione-2-oxime-O-benzoate, 1-(4-phenylsulfanylphenyl)-octane-1-one oxime-O-acetate, 1-(4-phenylsulfanylphenyl)-butane-1-one-2-oxime-O-acetate, 2-(O-benzoyloxime)-1-[4-(phenylthio)phenyl]-1,2-octanedione, 1-(O-acetyloxime)-1-[9-ethyl-6-(2-methylbenzoyl)-9H-carbazole-3-yl]ethanone, O-ethoxycarbonyl-α-oxyamino-1-phenylpropane-1-one, or any combination thereof.

According to an embodiment, the acetophenone-based compound may include 4-phenoxy dichloroacetophenone, 4-t-butyl dichloroacetophenone, 4-t-butyl trichloroacetophenone, 2,2-diethoxyacetophenone, 2-hydroxy-2-methyl-1-phenyl-propane-1-one, 1-(4-isopropylphenyl)-2-hydroxy-2-methyl-propane-1-one, 1-(4-dodecylphenyl)-2-hydroxy-2-methylpropane-1-one, 4-(2-hydroxyethoxy)-phenyl-(2-hydroxy-2-propyl)ketone, 1-hydroxy cyclohexyl phenyl ketone, 2-methyl-1-[4-(methylthio)phenyl]-2-morpholinopropane-1-one, or any combination thereof.

According to another embodiment, the thioxanthone-based compound may include thioxanthone, 2-chloro thioxanthone, 2-methyl thioxanthone, isopropyl thioxanthone, 2,4-diethyl thioxanthone, 2,4-diisopropyl thioxanthone, or any combination thereof.

According to another embodiment, the benzophenone-based compound may include benzophenone, benzoyl benzoic acid, benzoyl benzoic acid methyl ester, 4-phenyl benzophenone, hydroxy benzophenone, 4-benzoyl-4'-methyl diphenyl sulfide, 3,3'-dimethyl-4-methoxy benzophenone, or any combination thereof.

According to an embodiment, a weight ratio of the first photopolymerization initiator to the second photopolymerization initiator may be from about 1:1 to about 50:1. If the weight ratio of the first photopolymerization initiator to the second photopolymerization initiator is within this range, pattern characteristics may be improved due to an increase in photoinitiation efficiency.

According to an embodiment, a total amount of the first photopolymerization initiator and the second photopolymerization initiator may be from about 0.1 parts by weight to about 15 parts by weight based on 100 parts by weight of the total amount of the photoresist composition. According to another embodiment, the total amount of the first photopolymerization initiator and the second photopolymerization initiator may be from about 0.1 parts by weight to about 10 parts by weight based on 100 parts by weight of the total amount of the photoresist composition. If the total amount of the first photopolymerization initiator and the second photopolymerization initiator is within this range, the photopolymerizable monomer may be sufficiently photopolymerized when exposed to light during a pattern forming process, thereby preventing a decrease in transmittance caused by unreacted initiators.

Binder Resin

The binder resin may increase adhesion between a color filter prepared using the photoresist composition and a substrate by adjusting the viscosity of the photoresist composition such that a pattern with excellent surface smoothness may be formed during a developing process.

According to an embodiment, the binder resin may be alkali soluble.

According to an embodiment, the binder resin may include an epoxy resin, an acrylic resin, or any combination thereof.

The epoxy resin may improve heat resistance of a pattern formed using the photoresist composition and dispersion stability of the photo-luminescence nanocomposite such that a pixel having a desired resolution may be formed during the developing process.

According to an embodiment, the epoxy resin may be a phenol novolac epoxy resin, a tetramethyl biphenyl epoxy resin, a bisphenol A epoxy resin, a bisphenol F epoxy resin, an alicyclic epoxy resin, or any combination thereof.

According to another embodiment, an epoxy equivalent weight of the epoxy resin may be from about 150 g/eq to about 200 g/eq. If the epoxy equivalent weight of the epoxy is within this range, hardness of a pattern formed using the photoresist composition may be increased and the photo-luminescence nanocomposite may efficiently be fixed in a structure in which the pattern is formed.

The acrylic resin may prevent formation of protrusions on a pattern formed using the photoresist composition to improve heat resistance of the pattern, color properties of the pattern, such as brightness and contrast ratio, by increasing transmittance, and chemical resistance of the pattern.

The acrylic resin, which may be a copolymer of a first ethylenically unsaturated monomer and a second ethylenically unsaturated monomer copolymerizable therewith, may be a resin including at least one acrylic repeating unit.

The first ethylenically unsaturated monomer may be an ethylenically unsaturated monomer including at least one carboxyl group. For example, the first ethylenically unsaturated monomer may include acrylic acid, methacrylic acid, maleic acid, itaconic acid, fumaric acid, or any combination thereof.

According to an embodiment, an amount of the first ethylenically unsaturated monomer may be from about 1 to about 50 parts by weight based on 100 parts by weight of a total amount of the acrylic resin. According to another embodiment, the amount of the first ethylenically unsaturated monomer may be from about 5 to about 40 parts by weight based on 100 parts by weight of the total amount of the acrylic resin.

According to an embodiment, the second ethylenically unsaturated monomer may include: an aromatic vinyl compound such as styrene, α-methylstyrene, vinyltoluene, and vinylbenzylmethylether; an unsaturated carboxylic acid ester compound such as methyl(meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, and phenyl(meth)acrylate; an unsaturated carboxylic acid aminoalkyl ester compound such as 2-aminoethyl(meth)acrylate and 2-dimethylaminoethyl(meth)acrylate; a carboxylic acid vinyl ester compound such as vinyl acetate and vinyl benzoate: an unsaturated carboxylic acid glycidyl ester compound such as glycidyl (meth)acrylate; a vinyl cyanide compound such as (meth)acrylonitrile; an unsaturated amide compound such as (meth)acrylamide; or any combination thereof.

According to an embodiment, the acrylic resin may include a (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, or any combination thereof.

According to an embodiment, the binder resin may have a weight average molecular weight of about 6,000 g/mol to about 50,000 g/mol. According to another embodiment, the binder resin may have a weight average molecular weight of about 6,000 g/mol to about 16,000 g/mol. If the weight average molecular weight of the binder resin is within these ranges, the photoresist composition may have excellent physical and chemical properties and an appropriate viscosity and may provide excellent adhesion between a color filter and a substrate.

According to an embodiment, an amount of the binder resin may be from about 1 to about 30 parts by weight based on 100 parts by weight of the total amount of the photoresist composition. According to another embodiment, the amount of the binder resin may be from about 5 to about 20 parts by weight based on 100 parts by weight of the total amount of the photoresist composition. If the amount of the binder resin is within these ranges, excellent developing properties and high surface smoothness due to increased crosslinking may be obtained while preparing a color filter.

Solvent

The solvent may be a material having compatibility with the photo-luminescence nanocomposite, the photopolymerizable monomer, the first photopolymerization initiator, the second photopolymerization initiator, and the binder resin but not involved in reactions therewith.

For example, the solvent may include: an alcohol such as methanol and ethanol; an ester such as dichloroethyl ether, n-butyl ether, diisoamyl ether, methylphenyl ether, and tetrahydrofuran; a glycol ether such as ethylene glycol methyl ether, ethylene glycol ethyl ether, and propylene glycol methyl ether; a cellosolve acetate such as methyl cellosolve acetate, ethyl cellosolve acetate, and diethyl cellosolve acetate; a carbitol such as methylethyl carbitol, diethyl carbitol, diethylene glycol monomethyl ether, diethylene glycol monoethyl ether, diethylene glycol dimethylether, diethylene glycol methylethyl ether, and diethylene glycol diethyl ether; a propylene glycol alkyl ether acetate such as propylene glycol methyl ether acetate, propylene glycol monoethyl ether acetate, and propylene glycol propyl ether acetate; a aromatic hydrocarbons such as toluene and xylene; a ketone such as methylethylketone, cyclohexanone, 4-hydroxy-4-methyl-2-pentanone, methyl-n-propyl ketone, methyl-n-butyl ketone, methyl-n-amyl ketone, and 2-heptanone; a saturated aliphatic monocarboxylic acid alkyl ester such as ethyl acetate, n-butyl acetate, and isobutyl acetate; a lactic acid alkyl ester such as methyl lactate and ethyl lactate; a hydroxy acetic acid alkyl ester such as methyl hydroxy acetate, ethyl hydroxy acetate, and butyl hydroxy acetate; an acetic acid alkoxy alkyl ester such as methoxymethyl acetate, methoxyethyl acetate, methoxybutyl acetate, ethoxymethyl acetate, and ethoxyethyl acetate; a 3-hydroxypropionic acid alkyl ester such as methyl 3-hydroxypropionate and ethyl 3-hydroxypropionate; a 3-alkoxypropionic acid alkyl ester such as methyl 3-methoxypropionate, ethyl 3-methoxypropionate, ethyl 3-ethoxypropionate, and methyl 3-ethoxypropionate; a 2-hydroxypropionic acid alkyl ester such as methyl 2-hydroxypropionate, ethyl 2-hydroxypropionate, and propyl 2-hydroxypropionate; a 2-alkoxypropionic acid alkyl ester such as methyl 2-methoxypropionate, ethyl 2-methoxypropionate, ethyl 2-ethoxypropionate, and methyl 2-ethoxypropionate; a 2-hydroxy-2-methylpropionic acid alkyl ester such as methyl 2-hydroxy-2-methylpropionate and ethyl 2-hydroxy-2-methylpropionate; a 2-alkoxy-2-methylpropioic acid alkyl ester such as methyl 2-methoxy-2-methylpropionate and ethyl 2-ethoxy-2-methylpropionate; an ester such as 2-hydroxyethyl propionate, 2-hydroxy-2-methylethyl propionate, hydroxyethyl acetate, and methyl 2-hydroxy-3-methylbutanoate; or a ketonic acid ester such as ethyl pyruvate. In addition, the solvent may include N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octaneol, 1-nonanol, benzyl alcohol, benzyl acetate, ethyl benzoate, diethyl oxalate, diethyl malate, γ-butyrolactone, ethylene carbonate, propylene carbonate, phenyl cellosolve acetate, or any combination thereof.

According to an embodiment, the solvent may include: a glycol ether such as ethylene glycol monoethyl ether; an ethylene glycol alkylether acetate such as ethyl cellosolve acetate; an ester such as 2-hydroxyethyl propionate; a diethylene glycol such as diethylene glycol monomethyl ether; a propylene glycol alkylether acetate such as propylene glycol monomethyl ether acetate, propylene glycol propyl ether acetate; or any combination thereof.

An amount of the solvent may be from about 70 parts by weight to 98 parts by weight based on 100 parts by weight of the total amount of the photoresist composition. If the amount of the solvent is within this range, the photoresist composition may have an appropriate viscosity, such that the efficiency of processing a color filter using the photoresist composition may be increase.

Additive

The photoresist composition may further include an additive. The additive may include a thermal curing agent, a dispersant, an antioxidant, an UV absorbent, or any combination thereof.

The photoresist composition may further include a thermal curing agent to increase curing efficiency and curing rate of the composition.

For example, the thermal curing agent may include 2-mercaptobenzoimidazole, 2-mercaptobenzothiazole, 2-mercaptobenzoxazole, 2,5-dimercapto-1,3,4-thiadiazole, 2-mercapto-4,6-dimethylaminopyridine, pentaerythritol tetrakis (3-mercaptopropionate), pentaerythritol tris(3-mercaptopropionate), pentaerythritol tetrakis(2-mercaptoacetate), pentaerythritol tris(2-mercaptoacetate), trimethylolpropane tris(2-mercaptoacetate), trimethylolpropane tris(3-mercaptopropionate), trimethylolethane tris(2-mercaptoacetate), and trimethylolethane tris(3-mercaptopropionate), or any combination thereof.

The photoresist composition may further include a dispersant to increase dispersibility of the photo-luminescence nanocomposite.

For example, the dispersant may include a commercially available surfactant. The dispersant may include a silicon-based surfactant, a fluorine-based surfactant, an ester surfactant, a cationic surfactant, an anionic surfactant, a nonionic surfactant, an amphoteric surfactant, or any combination thereof. According to an embodiment, the dispersant may include a polyoxyethylenealkylether, a polyoxyethylenealkylphenylether, a polyethyleneglycoldiester, a sorbitan fatty acid ester, a fatty acid-modified polyester, a tertiary amine-modified polyurethane, a polyethylene imine, or any combination thereof. According to another embodiment, the dispersant may include a commercially available product such as KP (Shin-Etsu Chemical Co., Ltd.), POLYFLOW (Kyoeisha Chemical Co., Ltd.), EFTOP (Tohkem Products Corporation), MEGAFAC (Dainippon Ink and Chemicals, Inc.), Fluorad (Sumitomo 3M, Ltd.), Asahi Guard and Surflon (Asahi Glass Co., Ltd.), SORSPERSE (Zeneka Co.), EFKA (EFKA Chemicals), PB 821 (Ajinomoto Fine-Techno Co., Ltd.), or any combination thereof.

Examples of the antioxidant may include a phenolic antioxidant, an amine-based antioxidant, a phosphorus-based antioxidant, a sulfur-based antioxidant, or any combination thereof.

Examples of the phenolic antioxidant may include Irganox 1010 (Ciba), Irganox 1098 (Ciba), Irganox 1076 (Ciba), Cyanox 1790 (Cytech Products, Inc.), Tinuvin 120 (Basf), Tinuvin 326 (Basf), or any combination thereof.

Examples of the amine-based antioxidant may include N,N'-bis(1-ethyl-3-methylpentyl)-p-phenylenediamine, N,N'-bis(1-methylheptyl)-p-phenylenediamine, N,N'-dicyclohexyl-p-phenylenediamine, N,N'-bis(2-naphthyl)-p-phenylenediamine, N-isopropyl-N-phenyl-p-phenylenediamine, N-(1,3-dimethylbutyl)-N'-phenyl-p-phenylenediamine, N-(1-methylheptyl)-N'-phenyl-p-phenylenediamine, 1,2-bis[(2-methylphenyl)amino]ethane, 1,2-bis(phenyl-amino)propane, (o-tolyl)biguanide, bis[4-(1', 3'-dimethylbutyl)phenyl]amine, tert-octylated N-phenyl-1-naphthylamine, or any combination thereof.

Examples of the phosphorus-based antioxidant may include bis(dialkylphenyl)pentaerythritol diphosphite ester, phosphite ester, trioctyl phosphite, trilauryl phosphite, tridecyl phosphite, (octyl)diphenyl phosphite, tris(2,4-di-t-butylphenyl) phosphite, triphenyl phosphite, tris(butoxyethyl) phosphite, tris(nonylphenyl) phosphite, distearylpentaerythritol diphosphite, tetra(tridecyl)-1,1,3-tris(2-methyl-5-t-butyl-4-hydroxy-phenyl)butane diphosphite, tetra(C12-C15 mixed alkyl)-4,4'-isopropylidenediphenyl diphosphite, tetra(tridecyl)-4,4'-butylidenebis(3-methyl-6-t-butylphenol) diphosphite, tris(mono- and di-mixed nonylphenyl)phosphite, hydrogenated-4,4'-isopropylidenediphenol polyphosphite, phenyl 4,4'-isopropylidenediphenol)pentaerythritol diphosphite, distearylpentaerythritol diphosphite, tris[4,4'-isopropylidenebis(2-t-butylphenol)] phosphite, di(isodecyl)phenyl phosphite, or any combination thereof.

Examples of the sulfur-based antioxidant may include: an dialkylthiodipropionate such as dilaurylthiodipropionate, dimyristylthiodipropionate, and distearylthiodipropionate; a polyhydric alcohol (e.g., glycerin, trimethylolethane, trimethylolpropane, pentaerythritol, or trishydroxyethyl isocyanurate); an ester (pentaerythryl tetrakis-3-laurylthiopropionate) of an alkylthiopropioic acid such as butylthiopropioic acid, octylthiopropioic acid, laurylthiopropioic acid, and stearylthiopropioic acid ester, or any combination thereof.

Examples of the UV absorbent may include 2-(3-tert-butyl-2-hydroxy-5-methylphenyl)-5-chlorobenzotriazole, alkoxybenzophenone, or any combination thereof.

According to an embodiment, an amount of the additive may be from about 0.01 parts by weight to about 10 parts by weight based on 100 parts by weight of the total amount of the photoresist composition.

Method of Preparing Photoresist Composition

The photoresist composition may be prepared by adding the photo-luminescence nanocomposite, the photopolymerizable monomer, the first photopolymerization initiator, the second photopolymerization initiator, the binder resin, the solvent, and the additive to an agitator and stirring the mixture at room temperature for 30 minutes to 1 hour. In this regard, the photo-luminescence nanocomposite, the photopolymerizable monomer, the first photopolymerization initiator, the second photopolymerization initiator, the binder resin, the solvent, and the additive may be as described above.

Color Filter

Hereinafter, a color filter formed using the photoresist composition according to an embodiment will be described.

Figure 1:
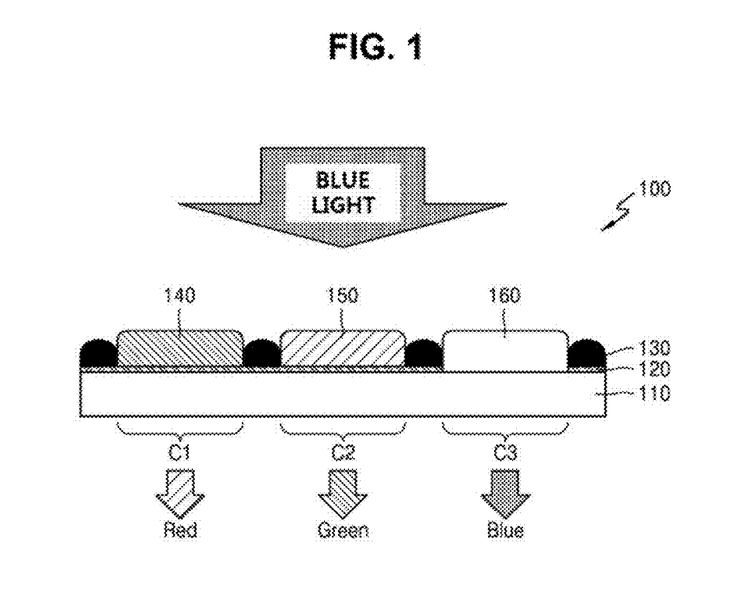
FIG. 1 illustrates a diagram schematically depicting a structure of a color filter according to an embodiment.

FIG. 1 is a diagram schematically illustrating a structure of a color filter 100 according to an embodiment.

Referring to FIG. 1, the color filter 100 includes a first pixel region C1, a second pixel region C2, and a third pixel region C3 to realize different colors. For example, when external light (e.g., blue light) is incident on the color filter 100, the first pixel region C1, the second pixel region C2, and the third pixel region C3 may emit red light, green light, and blue light, respectively.

The first pixel region C1 may include a first color conversion layer 140 to convert incident light into light having a first color. The first color conversion layer 140 includes a photocured product of a first photoresist composition. The first color conversion layer 140 may convert incident light into light having a longer wavelength than the incident light and emit the converted light.

The first color conversion layer 140 may include a photocured product of the first photoresist composition. In this regard, the first photoresist composition may be the same as those described above with reference to the photoresist composition.

According to an embodiment, a photo-luminescence nanocomposite included in the first photoresist composition may include the first quantum dot nanocomposite. In this regard, the first quantum dot nanocomposite may be as described above. As described above, the first quantum dot nanocomposite may emit light having a wavelength of about 620 nm to about 670 nm (i.e., red light) when external light (e.g., blue light) is applied thereto. Thus, when blue light is incident on the first pixel region C1, the blue light may be converted into red light by the first quantum dot nanocomposite included in the first color conversion layer 140.

According to an embodiment, the first pixel region C1 may further include a band-cut filter 120 to prevent emission of blue light that is not converted by the first color conversion layer 140 from the first pixel region C1.

The second pixel region C2 may include a second color conversion layer 150 to convert incident light into light having a second color. The second color conversion layer 150 may convert the incident light into light having a longer wavelength than the incident light and emits the converted light.

The second color conversion layer 150 may include a photocured product of the second photoresist composition. In this regard, the second photoresist composition may be the same as that described above with reference to the photoresist composition.

According to an embodiment, a photo-luminescence nanocomposite included in the second photoresist composition may include the second quantum dot nanocomposite. In this regard, the second quantum dot nanocomposite may be as described above. The second quantum dot nanocomposite may emit light having a wavelength of about 520 nm to about 570 nm (i.e., green light) when external light (e.g., blue light) is applied thereto. Thus, when blue light is incident on the second pixel region C2, the blue light may be converted into green light by the second quantum dot nanocomposite included in the second color conversion layer 150.

The third pixel region C3 may include a light scattering material layer 160 to scatter incident light. The light scattering material layer 160 does not convent the incident blue light, but instead, the third pixel region C3 emits the blue light.

According to an embodiment, the light scattering material layer 160 may include $TiO_2$.

According to an embodiment, the first pixel region C1, the second pixel region C2, and the third pixel region C3 may be disposed on a transparent substrate 110. Barrier walls 130 may be formed on the transparent substrate 110 to partition each of the pixel regions.

Display Apparatus

Hereinafter, a display apparatus including the color filter will be described.

Figure 2:
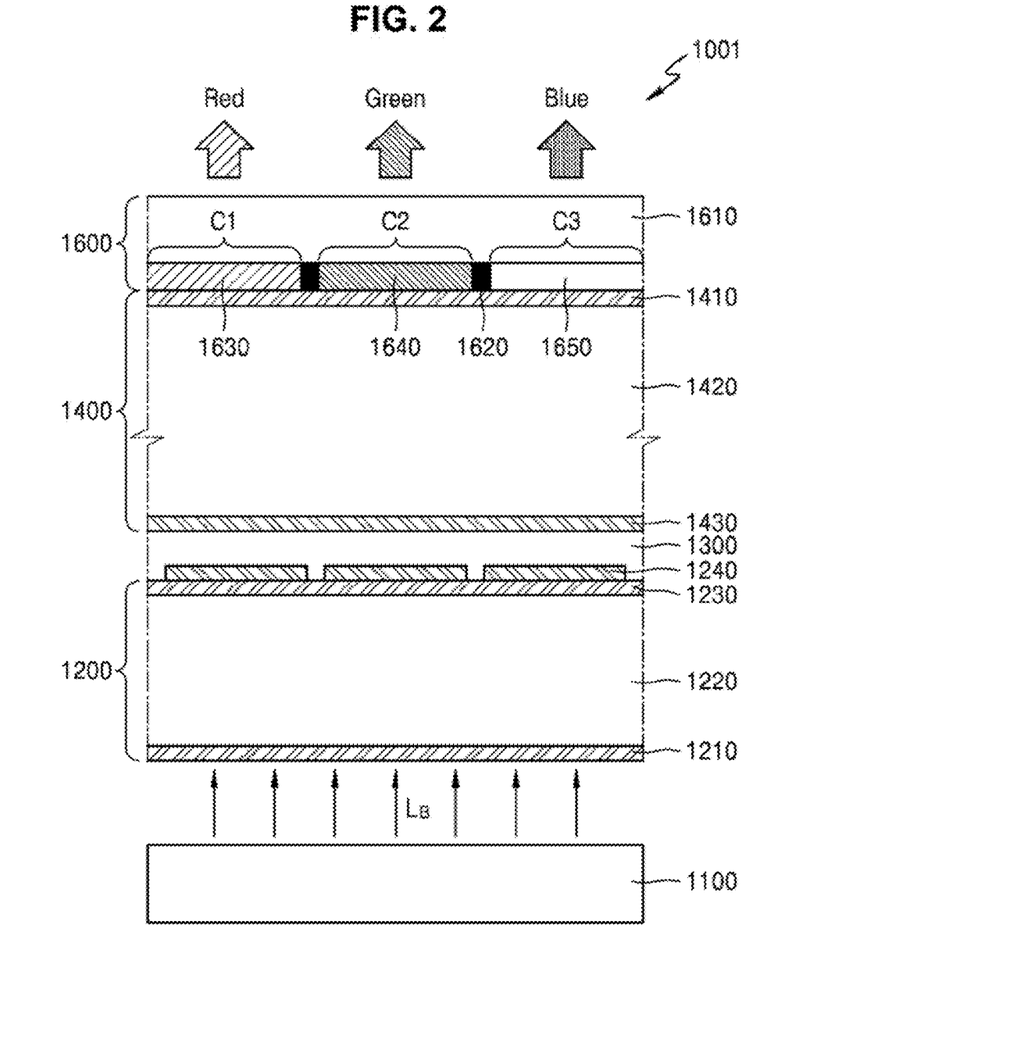
FIG. 2 illustrates a diagram schematically depicting a structure of a display apparatus according to an embodiment.

FIG. 2 is a diagram schematically illustrating a structure of a display apparatus 1001 according to an embodiment.

Referring to FIG. 2, the display apparatus 1001 may include a liquid crystal panel including a lower substrate 1200 and an upper substrate 1400, facing each other, and a liquid crystal layer 1300 disposed between the lower substrate 1200 and the upper substrate 1400, a backlight device 1100 to provide image-forming light to the liquid crystal panel, and a color filter 1600 to realize colors by converting a wavelength of light emitted from the backlight device 1100 and passing through the liquid crystal panel.

The backlight device 1100 may include a light source emitting blue light $L_B$ and may provide the blue light $L_B$ to the liquid crystal panel.

The lower substrate 1200 may include a first substrate 1220, a lower polarizing plate 1210 disposed on the bottom surface of the first substrate 1220, and a pixel electrode 1240 disposed on the top surface of the first substrate 1220. A thin film transistor (TFT) array layer 1230 including a plurality of transistors to control regions of the liquid crystal layer 1300 respectively corresponding to pixels is disposed between the first substrate 1220 and the pixel electrode 1240.

The first substrate 1220 may be formed of glass or a transparent plastic material.

The lower polarizing plate 1210 disposed on the bottom surface of the first substrate 1220 may transmit light polarized in a predetermined direction, for example, light linearly polarized in a first direction.

The TFT array layer 1230 may include a plurality of transistors and gate lines and data lines that respectively apply gate signals and data signals to the plurality of transistors.

The pixel electrode 1240 may be connected to a drain electrode of a transistor included in the TFT array layer 1230 and may receive a data voltage.

The upper substrate 1400 may include a second substrate 1420, an upper polarizing plate 1410 disposed on the top surface of the second substrate 1420, and a common electrode 1430 disposed on the bottom surface of the second substrate 1420.

The upper polarizing plate 1410 may transmit light linearly polarized in a second direction perpendicular to the light linearly polarized in the first direction passing through the lower polarizing plate 1210. In some implementations, both the upper polarizing plate 1410 and the lower polarizing plate 1210 may transmit light polarized in the same direction.

The liquid crystal layer 1300 may be disposed between the upper substrate 1400 and the lower substrate 1200. Alignment of liquid crystal molecules included in the liquid crystal layer 1300 may be controlled by a voltage applied between the common electrode 1430 and the pixel electrodes 1240. For example, regions of the liquid crystal layer 1300 between the common electrode 1430 and the pixel electrodes 1240 may be controlled between a mode of changing polarization of incident light (On-mode) and a mode of not changing polarization of incident light (Off-mode) in accordance with the voltage applied between the common electrode 1430 and the pixel electrode 1240.

The color filter 1600 may include a transparent substrate 1610, the first pixel region C1, the second pixel region C2, and the third pixel region C3 to realize different colors, and barrier walls 1620 to partition the pixel regions.

The first pixel region C1, the second pixel region C2, and the third pixel region C3 may be configured to realize red, green, and blue light, respectively, as described above with reference to FIG. 1. The first pixel region C1 may include a first color conversion layer 1630 to convert blue light $L_B$ into red light, the second pixel region C2 may include a second color conversion layer 1640 to convert blue light $L_B$ into green light, and the third pixel region C3 includes a light scattering material layer 1650.

In some implementations, band-cut filters to prevent the emission of blue light $L_B$ that is not converted into red and green light may further be disposed on the first pixel region C1 and the second pixel region C2, respectively.

When blue light $L_B$ emitted from the backlight device 1100 passes through the liquid crystal panel and is incident on the color filter 1600 in accordance with the on/off mode of each pixel region depending on image information and converted into red, green, and blue light, an image is displayed.

The photoresist composition and the color filter according to one or more embodiments will be described in more detail, according to the following Synthesis Examples, Examples, and Comparative Examples. The Examples and Comparative Examples are provided in order to highlight characteristics of one or more embodiments, but it is to be understood that the Examples and Comparative Examples are not to be construed as limiting the scope of the embodiments, nor are the Comparative Examples to be construed as being outside the scope of the embodiments. Further, it is to be understood that the embodiments are not limited to the particular details described in the Examples and Comparative Examples

EXAMPLES

Synthesis Example 1

Synthesis of First Quantum Dot Nanocomposite (Emission of Red Light)
Preparation of First Quantum Dot Nanoparticle (CdSe/CdS/ZnCdS)

2 mmol of CdO, 4 mmol of zinc acetate, and 5.5 mL of oleic acid were added to a reactor and maintained at 130° C. The reaction mixture was maintained in a vacuum at 100 mTorr for 20 minutes to remove acetic acid generated as the oleic acid was coordinated with zinc. Then, 20 mL of 1-octadecene was added thereto as a reaction solvent. The reaction mixture was heated to 310° C. to obtain a transparent mixture and maintained at 310° C. for 20 minutes. Then, a solution of Se and S, prepared by dissolving 0.2 mmol of powdered Se and 3.0 mmol of powdered S in 3 mL of trioctylphosphine, was rapidly added to the reactor including the solution of $Cd(OA)_2$ and $Zn(OA)_2$. The mixture was maintained at 310° C. for 5 minutes for growth thereof and the reaction was terminated. Then, a quantum dot was separated via precipitation using ethanol and via centrifugation and remaining impurities were washed using chloroform and ethanol to obtain a first quantum dot nanoparticle (CdSe/CdS/ZnCdS). Upon observing the obtained first quantum dot nanoparticle using a transmission electron microscope (TEM), it was confirmed that the core diameter was about 1.0 nm to about 4.0 nm, a first shell thickness was about 1.4 nm to about 2.0 nm, and a second shell thickness was about 1.0 nm to about 4.0 nm.

Figure 3:
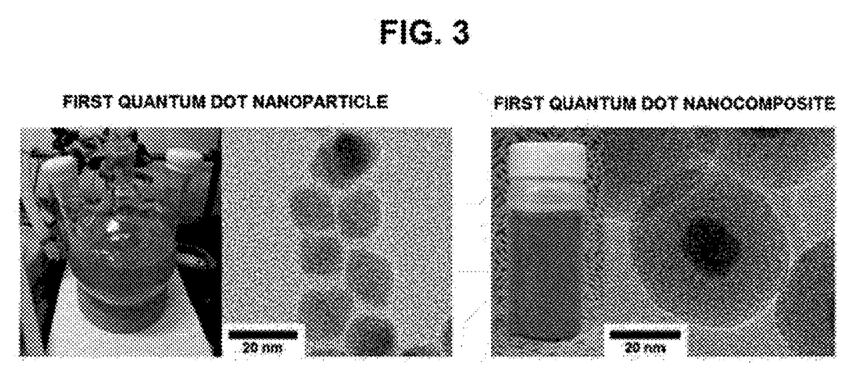
FIG. 3 illustrates a transmission electron microscope (TEM) image of a first quantum dot nanocomposite prepared according to Synthesis Example 1.

Preparation of First Quantum Dot Nanocomposite 10 mg of the first quantum dot nanoparticle was added to 10 mL of ethanol to prepare a first quantum dot nanoparticle-containing dispersion. Then, 0.1 mL of TEOS was added to 5 mL of the first quantum dot nanoparticle-containing dispersion and the mixture was stirred at room temperature for 10 minutes. Then, 0.1 mL of an N,N-dimethylacetamide (DMA) solution (40% by weight in water) and 0.1 mL of distilled water were added to the mixture, and the resultant mixture was stirred for 12 hours. Then, precipitates were isolated via centrifugation at 20,000 rpm for 20 minutes and a supernatant was removed therefrom. The isolated precipitates were re-dispersed in ethanol. Then, the re-dispersed solution was centrifuged at 4,000 rpm to remove aggregated particles, thereby obtaining a first quantum dot nanocomposite (a first quantum dot nanoparticle coated with $SiO_2$). Upon observing the obtained first quantum dot nanocomposite using a TEM, it was confirmed that the first quantum dot nanocomposite had a diameter of about 25 nm to about 43 nm. FIG. 3 shows a TEM image of the first quantum dot nanocomposite.

Synthesis Example 2

Synthesis of Second Quantum Dot Nanocomposite (Emission of Green Light)
Preparation of Second Quantum Dot Nanoparticle (CdZnSe/ZnS)

0.4 mmol of CdO, 2 mmol of zinc acetate, and 5.5 mL of oleic acid were added to a reactor and maintained at 130° C. The reaction mixture was maintained in a vacuum at 100 mTorr for 20 minutes to remove acetic acid generated as oleic acid was coordinated with zinc. Then, 20 mL of 1-octadecene was added thereto as a reaction solvent. The reaction mixture was heated to 310° C. to obtain a transparent mixture and maintained at 310° C. for 20 minutes. Then, a solution of Se and S prepared by dissolving 0.2 mmol of powdered Se and 2.0 mmol of powdered S in 3 mL of trioctylphosphine was rapidly added to the reactor including the solution of $Cd(OA)_2$ and $Zn(OA)_2$. The mixture was maintained at 310° C. for 5 minutes for growth thereof and reaction was terminated. Then, a quantum dot was separated via precipitation using ethanol and via centrifugation, and remaining impurities were washed using chloroform and ethanol to obtain a second quantum dot nanoparticle (CdZnSe/ZnS). Upon observing the obtained second quantum dot nanoparticle using a TEM, it was confirmed that a core diameter was about 1.0 nm to about 1.7 nm and a shell thickness was about 1.0 nm to about 10.0 nm.

Figure 4:
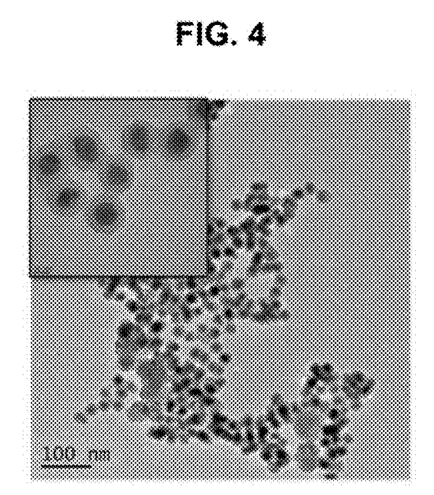
FIG. 4 illustrates a TEM image of a second quantum dot nanocomposite prepared according to Synthesis Example 2.
Figure 5:
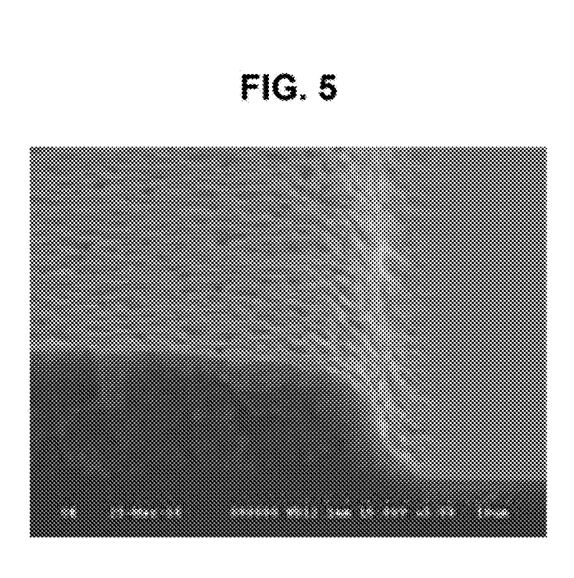
FIGS. 5 to 10 illustrate scanning electron microscope (SEM) images of Color Filters 1 to 6 having fine patterns and prepared according to Examples 2-1 and 2-2 and Comparative Examples 2-1 to 2-4, respectively.
Figure 6:
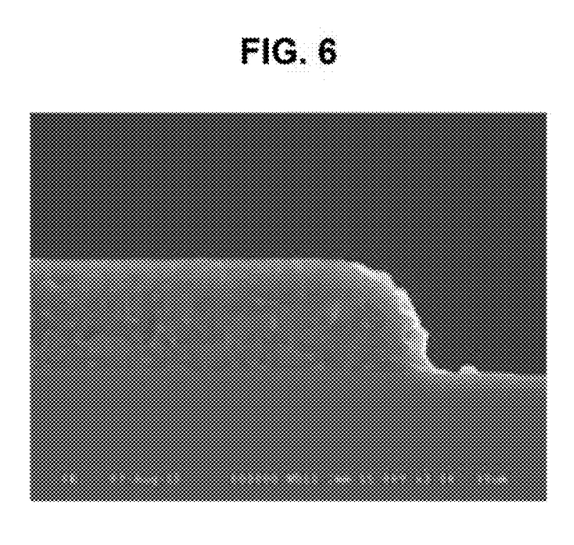
Figure 7:
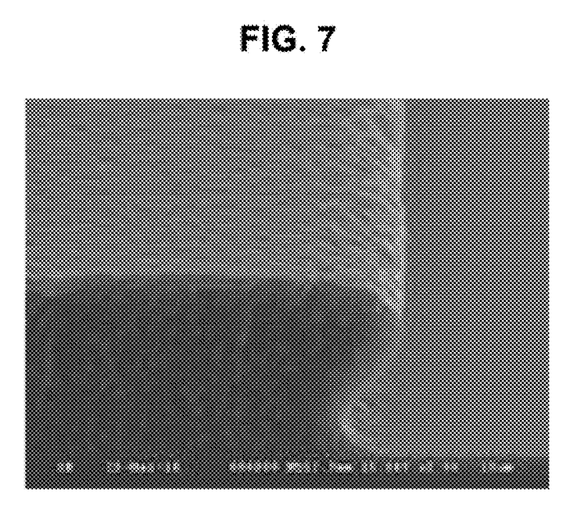
Figure 8:
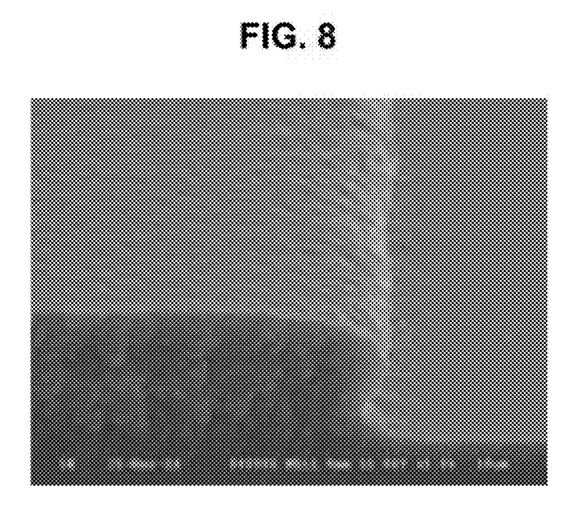
Figure 9:
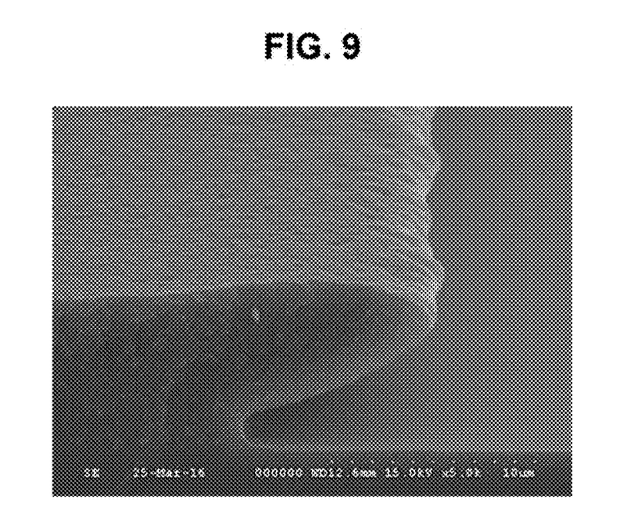
Figure 10:
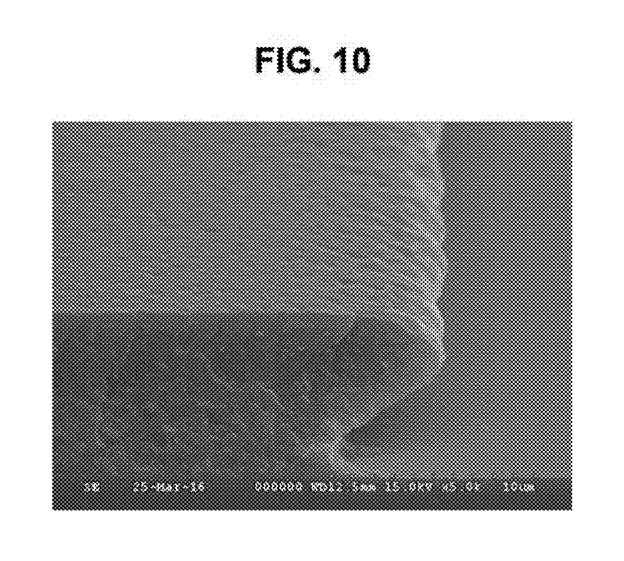

Preparation of Second Quantum Dot Nanocomposite 10 mg of the second quantum dot nanoparticle was added to 10 mL of ethanol to prepare a second quantum dot nanoparticle-containing dispersion. Then, 0.1 mL of TEOS was added to the second quantum dot nanoparticle-containing dispersion and the mixture was stirred at room temperature for 10 minutes. Then, 0.1 mL of a DMA solution (40% by weight in water) and 0.1 mL of distilled water were added to the mixture, and the resultant mixture was stirred for 12 hours. Then, precipitates were isolated via centrifugation at 20,000 rpm for 20 minutes and a supernatant was removed therefrom. The isolated precipitates were re-dispersed in ethanol. Then, the re-dispersed solution was centrifuged at 4,000 rpm to remove aggregated particles, thereby obtaining a second quantum dot nanocomposite (second quantum dot nanoparticle coated with $SiO_2$). Upon observing the obtained second quantum dot nanocomposite using a TEM, it was confirmed that the second quantum dot nanocomposite had a diameter of about 20 nm to about 32 nm. FIG. 4 shows a TEM image of the second quantum dot nanocomposite.

Example 1-1

Preparation of Photoresist Composition 1

30 parts by weight of the first quantum dot nanocomposite as a photo-luminescence nanocomposite, 9 parts by weight of dipentaerythritolpenta(meth)acrylate succinic acid ester (a carboxylic acid-containing penta-functional photopolymerizable compound, TO-1382, TOAGOSEI) and 24 parts by weight of dipentaerythritolhexaacrylate (KAYARAD DPHA, Nippon Kayaku Co., Ltd.) as photopolymerizable monomers. 3 parts by weight of 1-2-octanedione-1[(4-phenylthio)phenyl]-2-O-benzoyl-oxime (CGI-184, Ciba) as a first photopolymerization initiator, 2 parts by weight of 4-phenoxydichloroacetophenone as a second photopolymerization initiator, 30 parts by weight of hydroxylpropyl acrylate resin as a binder resin, and 2 parts by weight of Irganox 1010 (BASF) as an antioxidant were added to a 1000 mL reactor. The mixture was diluted using propyleneglycol monomethyletheracetate as a solvent to a solid content of 20% by weight to prepare Photoresist Composition 1.

Example 1-2

Preparation of Photoresist Composition 2

Photoresist Composition 2 was prepared in the same manner as in Example 1, except that the second quantum dot nanocomposite was used instead of the first quantum dot nanocomposite as the photo-luminescence nanocomposite.

Comparative Example 1-1

Preparation of Photoresist Composition 3

Photoresist Composition 3 was prepared in the same manner as in Example 1, except that the first quantum dot nanoparticle was used instead of the first quantum dot nanocomposite.

Comparative Example 1-2

Preparation of Photoresist Composition 4

Photoresist Composition 4 was prepared in the same manner as in Example 1, except that the second quantum dot nanoparticle was used instead of the first quantum dot nanocomposite.

Comparative Example 1-3

Preparation of Photoresist Composition 5

Photoresist Composition 5 was prepared in the same manner as in Example 1-1, except that 5 parts by weight of 1-2-octanedione-1[(4-phenylthio)phenyl]-2-O-benzoyl-oxime (CGI-184, Ciba) was used as the first photopolymerization initiator, and 4-phenoxy dichloroacetophenone was not used as the second photopolymerization initiator.

Comparative Example 1-4

Preparation of Photoresist Composition 6

Photoresist Composition 6 was prepared in the same manner as in Example 1-1, except that the second quantum dot nanocomposite was used instead of the first quantum dot nanocomposite, 5 parts by weight of 1-2-octanedione-1[(4-phenylthio)phenyl]-2-O-benzoyl-oxime (CGI-184, Ciba) was used as the first photopolymerization initiator, and 4-phenoxy dichloroacetophenone was not used as the second photopolymerization initiator.

Examples 2-1 and 2-2 and Comparative Examples 2-1 to 2-4

Preparation of Color Filters 1 to 6

Photoresist Compositions 1 to 6 according to Examples 1-1 and 1-2 and Comparative Examples 1-1 to 1-4 were coated on glass substrates by spin coating and maintained on a heating plate at 100° C. for 3 minutes (soft baking process) to prepare Thin Films 1 to 6, respectively.

A test photomask having a 20 mm×20 mm square transmission pattern and a line/space pattern having a line width of about 1 to about 100 μm was disposed on each of Thin Films 1 to 6 and UV light was applied thereto at a distance of 100 μm therefrom. In this case, UV light was applied thereto using an extra-high pressure mercury lamp (USH-250D) of USHIO DENKI Co., Ltd., as an UV light source, under atmospheric conditions at 365 nm with 200 mJ/cm$^2$ without using an optical filter. Then, the thin films were developed by dipping in a KOH aqueous solution having a pH of 10.5 for 80 seconds. The thin films were washed using distilled water, dried by nitrogen gas, heated in an oven at 200° C. for 10 minutes (hard baking process) to prepare Color Filters 1 to 6 according to Examples 2-1 and 2-2 and Comparative Examples 2-1 to 2-4. The prepared Color Filters 1 to 6 had a thickness of 5 μm.

Evaluation Example 1

Evaluation of Pattern Characteristics

Fine patterns were formed on Color Filters 1 to 6 by using a lint/space pattern mask having an opening width of 100 μm. Then, the surfaces of Color Filters 1 to 6 on which the fine patterns were formed were respectively observed using a scanning electron microscope (SEM), and pattern characteristics of Color Filters 1 to 6 were evaluated according to the following criteria. The results are shown in Table 1 below.

Good: No undercut on the surface of the fine pattern
Poor: Undercuts on the surface of the fine pattern
FIGS. 5 to 10 illustrate SEM images of the surfaces of Color Filters 1 to 6 having fine patterns.

TABLE 1

|  | Evaluation of pattern characteristics |
| --- | --- |
| Example 2-1 | good |
| Example 2-2 | good |

TABLE 1-continued

| | Evaluation of pattern characteristics |
|---|---|
| Comparative Example 2-1 | poor |
| Comparative Example 2-2 | poor |
| Comparative Example 2-3 | poor |
| Comparative Example 2-4 | poor |

Referring to Table 1 and FIGS. 5 to 10, the color filters of Examples 2-1 and 2-2 had better pattern characteristics than those of Comparative Examples 2-1 to 2-4.

Evaluation Example 2

Evaluation of Emission Intensity Retention Rate

After light was applied to the 20 mm×20 mm patterns of Thin Films 1 to 6 using a 365 nm Tube-type 4W UV lamp (VL-4LC, VILBERLOURMAT), intensities of light emitted by photo-luminescence at a wavelength of 640 nm in case of red light emission and at a wavelength of 545 nm in case of green light emission were measured using a spectrometer (Ocean Optics).

Then, after light was applied to the 20 mm×20 mm patterns of Color Filters 1 to 6 using a 365 nm Tube-type 4W UV lamp (VL-4LC, VILBERLOURMAT), intensities of light emitted by photo-luminescence at a wavelength of 640 nm in case of red light emission and at a wavelength of 545 nm in case of green light emission were measured using a spectrometer (Ocean Optics).

Then, the emission intensity retention rate was calculated according to Equation 1 below. The results are shown in Table 2 below. As the emission intensity retention rate increase, the luminescent efficiency increases.

Emission intensity retention rate=(emission intensity of color filter×100)/(emission intensity of thin film)    Equation 1

TABLE 2

| | Photoresist composition | Emission intensity retention rate (wavelength: 640 nm) | Emission intensity retention rate (wavelength: 545 nm) |
|---|---|---|---|
| Example 2-1 | 1 | 91 | — |
| Example 2-2 | 2 | — | 87 |
| Comparative Example 2-1 | 3 | 65 | — |
| Comparative Example 2-2 | 4 | — | 58 |
| Comparative Example 2-3 | 5 | 90 | — |
| Comparative Example 2-4 | 6 | — | 86 |

Referring to Table 2, the color filters of Examples 2-1 and 2-2 showed far better emission intensity retention rates than the color filters of Comparative Examples 2-1 to 2-4. It could be confirmed that the color filters of Examples 2-1 and 2-2 had excellent luminescent efficiency.

By way of summation and review, an LCD includes a color filter to realize colors. However, in a general LCD, the intensity of light emitted from a backlight light source may decrease by about ⅓ when the light passes through a red color filter, a green color filter, or a blue color filter such that the luminescent efficiency of the LCD may be low.

A photo-luminescent liquid crystal display apparatuses (PL-LCDs), in which a quantum dot color conversion layer (QD-CCL) replaces the color filter used in a general LCD helps to prevent a decrease in luminescent efficiency and improves color reproduction. A PL-LCD may display a color image by using visible light generated when light having a lower wavelength, such as ultraviolet light or blue light generated by a light source and adjusted by a liquid crystal layer, is applied to a color conversion layer (CCL).

Embodiments provide a photoresist composition and a color filter formed using the photoresist composition such that the color filter has excellent luminescent efficiency, color reproduction, and pattern characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A photoresist composition, comprising:
   a photo-luminescence nanocomposite;
   a photopolymerizable monomer;
   a first photopolymerization initiator;
   a second photopolymerization initiator;
   a binder resin; and
   a solvent,
   wherein the photo-luminescence nanocomposite includes a first quantum dot nanocomposite, a second quantum dot nanocomposite, or a combination thereof,
   the first quantum dot nanocomposite includes a first quantum dot nanoparticle and a first coating layer surrounding the first quantum dot nanoparticle, the first coating layer including a first inorganic material,
   the second quantum dot nanocomposite includes a second quantum dot nanoparticle and a second coating layer surrounding the second quantum dot nanoparticle, the second coating layer including a second inorganic material,
   the first photopolymerization initiator includes an oxime-based compound, and
   the second photopolymerization initiator includes an acetophenone-based compound, a thioxanthone-based compound, a benzophenone-based compound, or a combination thereof.

2. The photoresist composition as claimed in claim 1, wherein the first quantum dot nanoparticle has a core-shell-shell structure including a core including a first semiconductor nanocrystal, a first shell surrounding the core and including a second semiconductor nanocrystal, and a second shell including a third semiconductor nanocrystal.

3. The photoresist composition as claimed in claim 2, wherein the first semiconductor nanocrystal, the second semiconductor nanocrystal, and the third semiconductor nanocrystal each independently include CdS, CdSe, CdTe, ZnS, ZnSe, ZnTe, InP, InN, InAs, GaN, GaP, GaAs, ZnCdS, ZnSeS, ZnCdSeS, CdZnSe, InZnP, InGaP, GaPZnS, GaPZnSe, GaPZnSeS, or a combination thereof.

4. The photoresist composition as claimed in claim 1, wherein the second quantum dot nanoparticle has a core-shell structure including a core having a fourth semiconductor nanocrystal and a shell surrounding the core, the shell including a fifth semiconductor nanocrystal.

5. The photoresist composition as claimed in claim 4, wherein the fourth semiconductor nanocrystal and the fifth semiconductor nanocrystal each independently include CdS, CdSe, CdTe, ZnS, ZnSe, ZnTe, InP, InN, InAs, GaN, GaP, GaAs, ZnCdS, ZnSeS, ZnCdSeS, CdZnSe, InZnP, InGaP, GaPZnS, GaPZnSe, GaPZnSeS, or a combination thereof.

6. The photoresist composition as claimed in claim 1, wherein the first inorganic material and the second inorganic material each independently include $SiO_2$, $TiO_2$, $ZnO_2$, $Al_2O_3$, alumina, or a combination thereof.

7. The photoresist composition as claimed in claim 1, wherein:
the first quantum dot nanocomposite further includes a first auxiliary layer between the first quantum dot nanoparticle and the first coating layer, and
the second quantum dot nanocomposite further includes a second auxiliary layer between the second quantum dot nanoparticle and the second coating layer.

8. The photoresist composition as claimed in claim 7, wherein the first auxiliary layer and the second auxiliary layer each independently include polyvinylpyrrolidone, polystyrene, polymethylmethacrylate, or a combination thereof.

9. The photoresist composition as claimed in claim 1, wherein the photopolymerizable monomer includes ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, dipentaerythritol penta (meth)acrylate-succinic acid ester, or a combination thereof.

10. The photoresist composition as claimed in claim 1, wherein the oxime-based compound includes 1,2-octanedione, 2-dimethylamino-2-(4-methylbenzyl)-1-(4-morpholine-4-yl-phenyl)-butane-1-one, 1-(4-phenylsulfanylphenyl)-butane-1,2-dione-2-oxime-O-benzoate, 1-(4-phenylsulfanylphenyl)-octane-1,2-dione-2-oxime-O-benzoate, 1-(4-phenylsulfanylphenyl)-octane-1-one oxime-O-acetate, 1-(4-phenylsulfanylphenyl)-butane-1-one-2-oxime-O-acetate, 2-(O-benzoyloxime)-1-[4-(phenylthio)phenyl]-1,2-octanedione, 1-(O-acetyloxime)-1-[9-ethyl-6-(2-methylbenzoyl)-9H-carbazole-3-yl]ethanone, O-ethoxycarbonyl-α-oxyamino-1-phenylpropane-1-one, or a combination thereof.

11. The photoresist composition as claimed in claim 1, wherein:
the second photopolymerization initiator includes the acetophenone-based compound, and
the acetophenone-based compound includes 4-phenoxy dichloroacetophenone, 4-t-butyl dichloroacetophenone, 4-t-butyl trichloroacetophenone, 2,2-diethoxyacetophenone, 2-hydroxy-2-methyl-1-phenyl-propane-1-one, 1-(4-isopropylphenyl)-2-hydroxy-2-methyl-propane-1-one, 1-(4-dodecylphenyl)-2-hydroxy-2-methylpropane-1-one, 4-(2-hydroxyethoxy)-phenyl-(2-hydroxy-2-propyl)ketone, 1-hydroxy cyclohexyl phenyl ketone, 2-methyl-1-[4-(methylthio)phenyl]-2-morpholino-propane-1-one, or a combination thereof.

12. The photoresist composition as claimed in claim 1, wherein:
the second photopolymerization initiator includes the thioxanthone-based compound, and
the thioxanthone-based compound includes thioxanthone, 2-chloro thioxanthone, 2-methyl thioxanthone, isopropyl thioxanthone, 2,4-diethyl thioxanthone, 2,4-diisopropyl thioxanthone, or a combination thereof.

13. The photoresist composition as claimed in claim 1, wherein:
the second photopolymerization initiator includes the benzophenone-based compound, and
the benzophenone-based compound includes benzophenone, benzoyl benzoic acid, benzoyl benzoic acid methyl ester, 4-phenyl benzophenone, hydroxy benzophenone, 4-benzoyl-4'-methyl diphenyl sulfide, 3,3'-dimethyl-4-methoxy benzophenone, or a combination thereof.

14. The photoresist composition as claimed in claim 1, wherein the binder resin includes an epoxy resin, an acrylic resin, or a combination thereof.

15. The photoresist composition as claimed in claim 1, wherein the solvent includes ethylene glycol monoethyl ether, ethyl cellosolve acetate, 2-hydroxyethyl propionate, diethylene glycol monomethyl, propylene glycol monomethyl ether acetate, propylene glycol propyl ether acetate, or a combination thereof.

16. A color filter comprising a first pixel region, a second pixel region, and a third pixel region,
wherein the first pixel region includes a first color conversion layer to convert incident light into light having a first color,
the second pixel region includes a second conversion layer to convert incident light into light having a second color,
the third pixel region includes a light scattering material layer,
the first color conversion layer includes a photocured product of a first photoresist composition, and the second color conversion layer includes a photocured product of a second photoresist composition, and
the first photoresist composition and the second photoresist composition are different from each other and are each independently selected from a photoresist composition according to claim 1.

17. The color filter as claimed in claim 16, wherein the photo-luminescence nanocomposite included in the first photoresist composition includes a first quantum dot nanocomposite, and
the photo-luminescence nanocomposite included in the second photoresist composition includes a second quantum dot nanocomposite.

18. The color filter as claimed in claim 16, wherein the light scattering material layer includes $TiO_2$.

19. The color filter as claimed in claim 16, wherein the incident light is blue light.

20. The color filter as claimed in claim 16, wherein the first color is red and the second color is green.

* * * * *